(12) United States Patent
Meng et al.

(10) Patent No.: US 12,212,335 B2
(45) Date of Patent: Jan. 28, 2025

(54) REFERENCE-RIPPLE COMPENSATION TECHNIQUE FOR SAR ADC

(71) Applicant: Avago Technologies International Sales Pte. Limited, Singapore (SG)

(72) Inventors: Xin Meng, Ladera Ranch, CA (US); Yong Liu, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 128 days.

(21) Appl. No.: 18/126,924

(22) Filed: Mar. 27, 2023

(65) Prior Publication Data
US 2024/0333300 A1    Oct. 3, 2024

(51) Int. Cl.
*H03M 1/46* (2006.01)
*H03M 1/06* (2006.01)
*H03M 1/08* (2006.01)

(52) U.S. Cl.
CPC ......... *H03M 1/462* (2013.01); *H03M 1/0607* (2013.01); *H03M 1/0863* (2013.01); *H03M 1/466* (2013.01)

(58) Field of Classification Search
CPC .... H03M 1/462; H03M 1/0607; H03M 1/466; H03M 1/0863
USPC ............................... 341/155, 158, 161, 172
See application file for complete search history.

(56) References Cited

U.S. PATENT DOCUMENTS 10,727,856 B2 *   7/2020  Wu .................... H03M 1/0624
10,804,917 B1 *  10/2020  Chang .................... H03M 1/38

OTHER PUBLICATIONS

Brian P. Ginsburg et al: 11 500-MS/s 5-bit ADC in 65-nm CMOS With Split Capacitor Array DAC, IEEE Journal of Solid-State Circuits, IEEE, USA, vol. 42, No. 4, Apr. 1, 2007 (Apr. 1, 2007), pp. 739-747, XP011175857, ISSN: 0018-9200, DOI: 10.1109/JSSC.2007.892169.

Extended European Search Report on EP Appln No. 24166357.4 mailed Sep. 2, 2024 (9 pages).

Jiang Wenning et al: "A Single-Channel 14b 500 MS/s Pipelined-SAR ADC with Reference Ripple Mitigation Techniques and Adaptive-Biased Floating Inverter Amplifier", 2022 IEEE Asian Solid- State Circuits Conference (A-SSCC), IEEE, Nov. 6, 2022 (Nov. 6, 2022), pp. 1-3, XP034252069, DOI: 10.1109/A-SSCC56115.2022.9980749 [retrieved on Dec. 19, 2022] * figures 1-3 *.

(Continued)

*Primary Examiner* — Khai M Nguyen
(74) *Attorney, Agent, or Firm* — Foley & Lardner LLP (57) ABSTRACT

An analog-to-digital converter (ADC) circuit includes a digital-to-analog converter (DAC) circuit, a comparator circuit, an encoder, and a compensation circuit. The DAC circuit receives a reference voltage and provides an output signal based on the reference voltage. The comparator circuit compares the output signal with an analog input signal and generates a comparison signal. A reset command is generated based on the output signal being greater than the analog input signal. The encoder splits a ripple associated with the reference voltage into multiple pulses in response to a reset command. The compensation circuit generates, responsive to the reset command, compensation pulses to compensate the multiple pulses.

20 Claims, 6 Drawing Sheets

(56) References Cited

OTHER PUBLICATIONS

Shen Yi et al: "A 10-bit 120-MS/s SAR ADC 1-15 With Reference Ripple Cancellation Technique", IEEE Journal of Solid-State Circuits, IEEE, USA, vol. 55, No. 3, Oct. 18, 2019 (Oct. 18, 2019), pp. 680-692, XP011774163, ISSN: 0018-9200, DOI: 10.1109/JSSC.2019.2946215 retrieved on Feb. 25, 2020] * Abstract; figures 2,3,4,6 *.

* cited by examiner

REFERENCE-RIPPLE COMPENSATION TECHNIQUE FOR SAR ADC

TECHNICAL FIELD

The present description relates generally to data communications including, for example, a reference-ripple compensation technique for successive-approximation register (SAR) analog-to-digital converter (ADC).

BACKGROUND

There are different types of analog-to-digital converters (ADCs) including flash ADC, Semi-flash ADC, successive approximation register (SAR) ADC, sigma-delta ADC and pipeline ADC, each having different structure and application. The SAR ADC, which is of interest in the subject disclosure, is identified by its successive approximation register and successively compares an input voltage and an output voltage of an internal ADC and judges whether the input is above or below a narrowing range's midpoint and continues this process until a specified resolution is achieved.

SAR ADC has been widely used in all kinds of systems, especially data communication circuits and systems. Time-interleaved (TI) SAR ADC dominates high-speed, low-power, and low-area ADC applications. High-performance TI SAR ADC is an important circuit in receiver of the 5G radiofrequency (RF) base stations. However, performance with the high signal-to-noise distortion ratio (SNDR) and spurious-free dynamic range (SFDR) usually sacrifice speed, power, chip area, and other metrics. Among all circuit blocks in a high-resolution TI SAR, the narrow-bandwidth reference buffer is used to achieve three design metrics of a TI SAR, including linearity, power, and chip area.

Due to the correlations and tradeoffs, fundamentally, it would be difficult to achieve the three design targets at the same time. Furthermore, a reference buffer ripple in the TI SAR is a significant degradation contributor for SNDR and SFDR. In TI SAR, the capacitive digital-to-analog converter (DAC) will be charged/discharged during reset and conversion cycles, which causes ripples (e.g., voltage fluctuations) on the reference voltage. Calibration and/or compensation is utilized to decrease reference ripple for high-resolution ADC. However, process, voltage, and temperature (PVT) changes can make the calibration and/or compensation less effective. In some extreme corners, reference ripple may even increase.

An existing architecture is a reference calibration SAR architecture in which an additional conversion cycle is used to detect and correct the error bit caused by reference ripple. In this way, SAR achieves higher resolution and reduces on-chip decoupling capacitors significantly. However, the architecture uses an error-correction scheme. The error-cover range of this scheme limits the resolution, and the required extra conversion cycle limits the speed of the overall SAR ADC.

Another existing reference compensation architecture includes a charge generator that provides the required charge for two reference voltages $V_{ref1}$ and $V_{ref2}$, so the reference ripple can be reduced. The reference charge compensation of this architecture works with perfect timing matching, which can be degraded by the PVT changes. This architecture compensates reference ripple for only flash ADCs but not for TI-SARs. Flash ADCs and SAR ADCs have very different ADC timings, so their reference voltage ripples show different characteristics. In time-interleaved ADCs, a ripple provides a significant portion of the reference voltage, which is not compensated by this architecture.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block-diagram form in order to avoid obscuring the concepts of the subject technology.

According to some aspects, the subject technology is directed to a reference-ripple compensation apparatus and technique for an analog-to-digital converter (ADC) such as a successive-approximation register (SAR) ADC including time-interleaved (TI) SAR ADC circuits. The disclosed reference-ripple compensation technique breaks the limitations caused by the process, voltage, and temperature (PVT) changes by using a reference charge compensation (RCC) circuit with multiple pulses compensation. The subject technology splits a large peak charge of a ripple (e.g., a reset ripple) into a dual half-peak charge for compensation. The ripple is a significant voltage component of the reference voltage of the ADC and is compensated by the subject disclosure. The width of the reset time window is doubled, which allows toleration of more timing variations and significantly decreases any compensation overshoot.

The disclosed technique results in a number of advantageous features at circuit, system, and product levels.

At the circuit level, compared to time-interleaved SAR ADC without reference-ripple compensation, the disclosed architecture achieves enhanced signal-to-noise distortion ratio (SNDR) and spurious-free dynamic range (SFDR). Because the reference ripple is compensated inside each SAR, and no adjacent SAR is affected, more design freedom can be utilized to improve SAR performance in high-resolution time-interleaved ADC. In some embodiments, more than 90 dB SFDR can be achieved with only reference-ripple spur. Moreover, the reference compensation technique of the subject technology reduces the decoupling capacitance area, which is a significant portion of the SAR area. Additionally, each SAR unit is designed to be compact and SAR spacing is reduced. Therefore, the overall TI SAR area efficiency is significantly improved without increasing power for parasitic signals and sacrificing SAR speed. In some embodiments, the overall TI SAR area efficiency can be improved by about 10% to 15%. Moreover, the PVT changes, which degrade the effects of existing reference-ripple compensation circuits, are well tolerated by the disclosed architecture without sacrificing other metrics.

At the system level, by applying the disclosed technique, the SAR ADC area can be further reduced. For example, for a 5 nm, 400 MS/s, 11-bit CMOS SAR ADC prototype, the overall SAR ADC area can be reduced by about ten percent. Since SAR ADC contributes about one-third of the total SFDR, the whole receiver can release the linearity requirement for the analog front-end (AFE) and the track-hold due to the disclosed architecture.

At the product level, the subject technology provides one of the key distinctive enabling techniques to achieve extremely high SFDR for certain receivers. In some embodiments, the reference ripple spur can be lower than about-100 decibel full scale (dBFS). Also, the subject technology can result in a significant area reduction (e.g., about 10% to 15%) while maintaining high resolution for a broad range of products involving time-interleaved ADC, including 5G radiofrequency (RF) base station receivers, optical links, serializer-deserializer (SERDES) chips, and other products. Implementing the disclosed technique may result in competitive area and power advantages for high-resolution, high-speed ADC-based product market.

Figure 1:
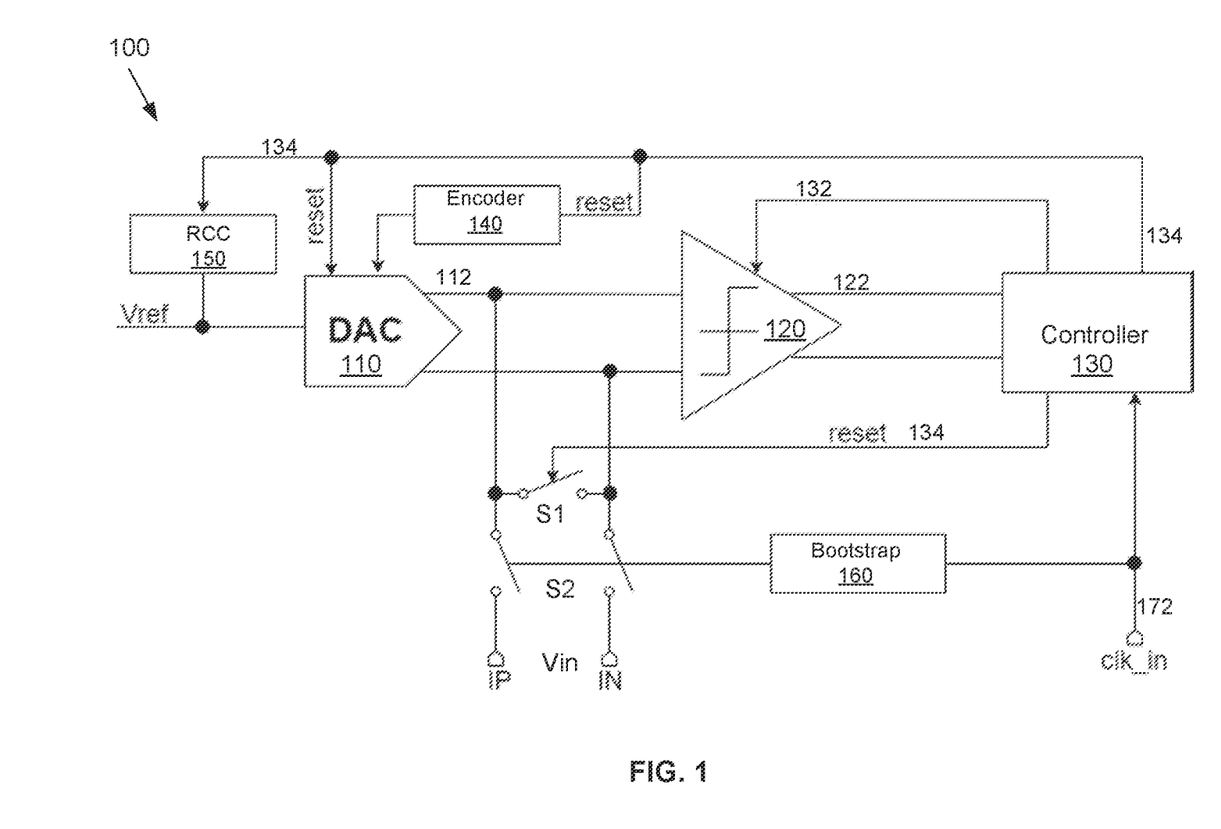
FIG. 1 is a block diagram illustrating an example of an apparatus representing an analog-to-digital converter (ADC) within which some aspects of the subject technology are implemented.

FIG. 1 is a block diagram illustrating an example of an apparatus representing an ADC 100 within which some aspects of the subject technology are implemented. In some embodiments, the apparatus is an integrated circuit. In some embodiments the ADC 100 is a SAR ADC. The ADC 100 includes a digital-to-analog converter (DAC) circuit 110, a comparator circuit 120, a controller circuit 130, an encoder circuit 140, a compensation circuit 150, a bootstrap circuit 160, and switches S1 and S2. In some embodiments, the DAC circuit 110 is a circuit that receives a reference voltage, Vref, and generates a DAC output signal 112 based on Vref. In some embodiments, the reference voltage is provided by a power supply and determines the highest value of the input analog signal that the ADC can convert. For example, if the input analog signal varies within a range between 0 V to 5 V, the reference voltage can be 5 V. The accuracy and stability of the reference voltage is an important factor for a precision analog to digital conversion. Ripples associated with the reference voltage, such as the reset ripple has to be compensated to reduce errors in conversion. In some embodiments, the DAC circuit 110 uses the reference voltage to produce an accurate analog output voltage corresponding to the input digital signal of the DAC circuit 110. Ripples associated with the reference voltage are unwanted variations superimposed on the reference voltage, which is typically a constant voltage. Ripples can be caused, for example, by noise, electromagnetic interferences, charging and discharging of parasitic capacitances.

In some embodiments, the comparator circuit 120 is a circuit that compares the DAC output signal 112 with an analog input signal Vin applied to the positive and negative input terminals IP and IN and generates a comparison signal 122. In some implementations, the comparison signal 122 includes the result of the comparison. In one or more embodiments, the controller circuit 130 is a circuit that receives the comparison signal 122 and produces a reset command 134 based on the comparison signal 122, and then provides the reset command 134 to the encoder circuit 140 and the compensation circuit 150. In some embodiments, the controller circuit 130 also provides a control signal 132 to the comparator circuit 120 to control its operations. In some implementations, the controller circuit 130 can be a finite state machine (FSM) circuit that generates the reset command 134 based on the comparison and provides the reset command 134 to the encoder circuit 140 and the compensation circuit 150.

In some implementations, the encoder circuit 140 is a most significant bit (MSB) encoder. In some embodiments, the encoder is a circuit that can split a ripple into multiple pulses (e.g., a dual-peak ripple) in response to a reset command (e.g., reset command 134). In some embodiments, the reset command is provided by the controller circuit 130 based on the comparison signal 122. For example, if the comparison result is positive, that is the DAC output signal is greater than the analog input signal Vin. When the comparison is performed, the reset command is generated. In some embodiments, the reset ripple is created on the reference voltage by charging and discharging of the capacitors of the DAC circuit 110 during the reset cycles. Similarly, MSB ripple and least significant bit (LSB) ripples are created during the conversion cycles. The magnitude of the reset ripple may be larger (e.g., twice as large) than the magnitude of the MSB ripples and can dominate the reference voltage. The subject technology provides a technique for overcoming the reset ripple as well as the MSB ripple, and further LSB ripples. In order to splitting the reset ripple into two pulses, the encoder circuit 140 extends a reset window by splitting MSB and LSBs ripples in the time domain. For multiple pulses, the encoder circuit 140 can further splits LSBs into MSB-1 and other LSBs.

In some embodiments, the compensation circuit 150 is a reference charge compensation (RCC) circuit that generate compensation pulses. In some embodiments, the two compensation pulses are two reference charge pulses that are used to compensate the ripple. In some embodiments, compensating the reset ripple includes adjusting the widths and magnitudes of the two compensation pulses to offset the multiple pulses to reduce amplitudes of the multiple pulses to a level within a specified range defined by the design specification. In some embodiments, the terms "compensate," "compensating," or "compensated" refers to an offset of a value (e.g., of a voltage), which may include a reduction of amplitude or complete elimination, or cancelling, of the value. In some embodiments, for the two-pulse compensation, the reference voltage ripple can be reduced by about 70%. In some embodiments, the compensation circuit 150 generates further compensation pulses to compensate the MSB and LSB ripples in each conversion cycle. In some implementations, the compensation circuit 150 generates the compensation pulses by providing (e.g., injecting) a charge into a reference-voltage port of the DAC circuit, as discussed in more details herein. In some embodiments, the generation of the compensation pulses occurs prior to receiving, by the DAC circuit 110, a subsequent reference voltage.

In some embodiments, the reset command 134 is also received by the DAC circuit 110 to initiate a reset cycle.

During the reset cycle, the switch S1 is closed by the reset command 134 to disable (shorten) the input signal Vin. In some embodiments, the switch S2 is a sampling switch and can be controlled by the bootstrap circuit 160 to sample the input signal Vin based on the clock signal 172 (clk_in).

Figure 2:
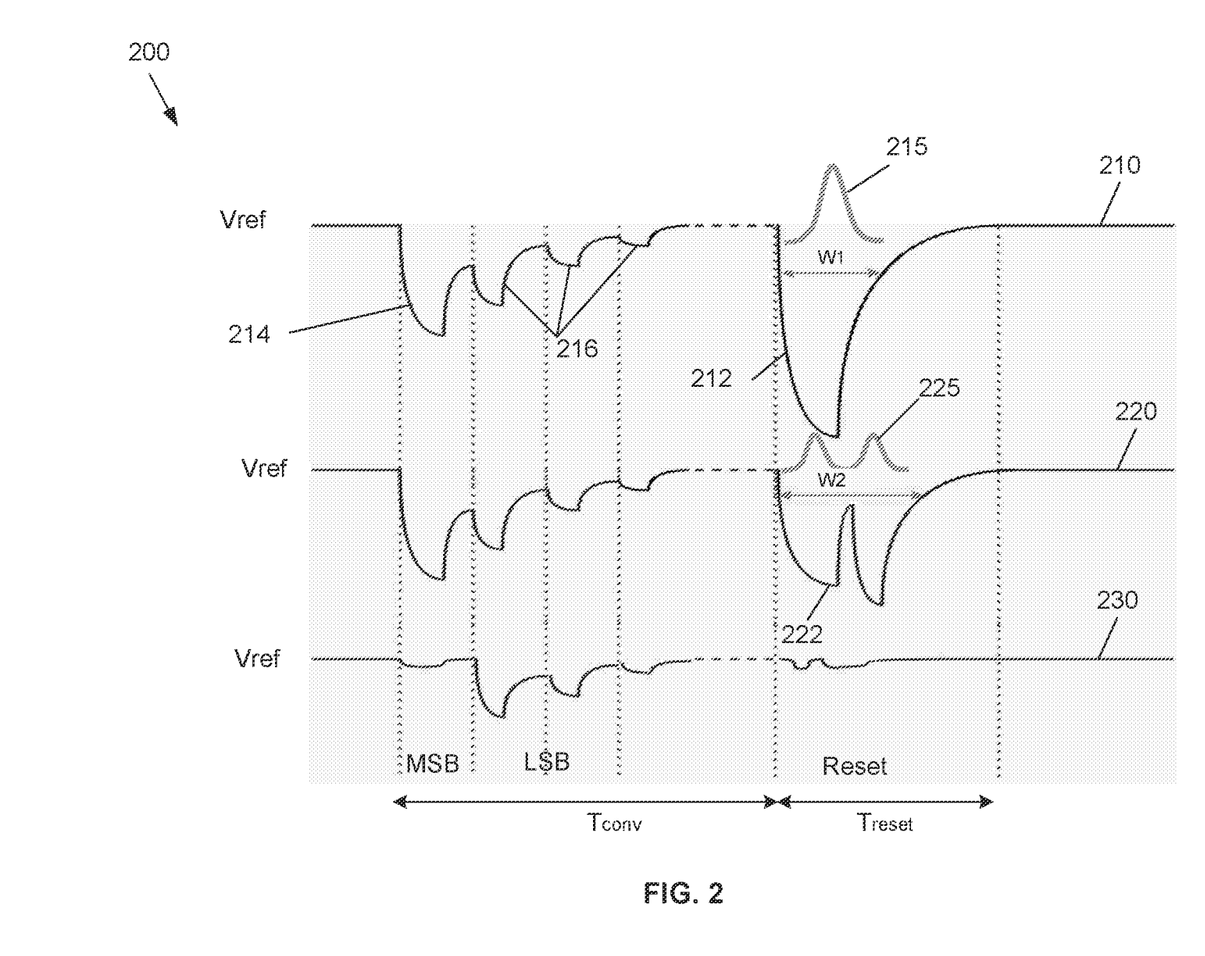
FIG. 2 is a chart illustrating examples of ripples in a reference voltage of an ADC before and after compensation, according to aspects of the subject technology.

FIG. 2 is a chart 200 illustrating examples of ripples in a reference voltage of an ADC (e.g., a SAR ADC) before and after compensation, according to aspects of the subject technology. In some embodiments, the reference voltage sets the highest value of an input signal to be measured b y a DAC circuit of the SAR ADC. The chart 200 includes plots 210, 220, and 230. The plot 210 shows a ripple 212 within a reset cycle or window (Treset), an MSB ripple 214, and LSB ripples 216 during a conversion cycle (Tconv). The ripple 212 is the dominant ripple and cannot be offset by a single compensation pulse 215 that an existing architecture provides.

The plot 220 shows the two pulses 222, which, in some embodiments, is formed by splitting the ripple 212 using the encoder circuit 140 of FIG. 1. In some embodiments, the two pulses 222 has a width W2 that is twice the width W1 of the ripple 212. The two compensation pulses 225 are produced by the compensation circuit 150 of FIG. 1. The magnitude and widths of the two compensation pulses 225 are adjusted to reduce or offset the multiple pulses 222. In some embodiments, offsetting the multiple pulses 222 can reduce amplitudes of the multiple pulses 222 to a level within a specified range according to a design specification. In some embodiments, the reset ripple amplitude is reduced to about 10% of the value of the ripple 212.

The plot 230 shows the result of the compensation by the compensation circuit 150 of the ripple 212 and MSB ripple 214. In some embodiments, the compensation of the MSB ripples is achieved by being offset by a single compensation pulse. In some embodiments, the LSB ripples 216 can also be compensated similarly.

Figure 3:
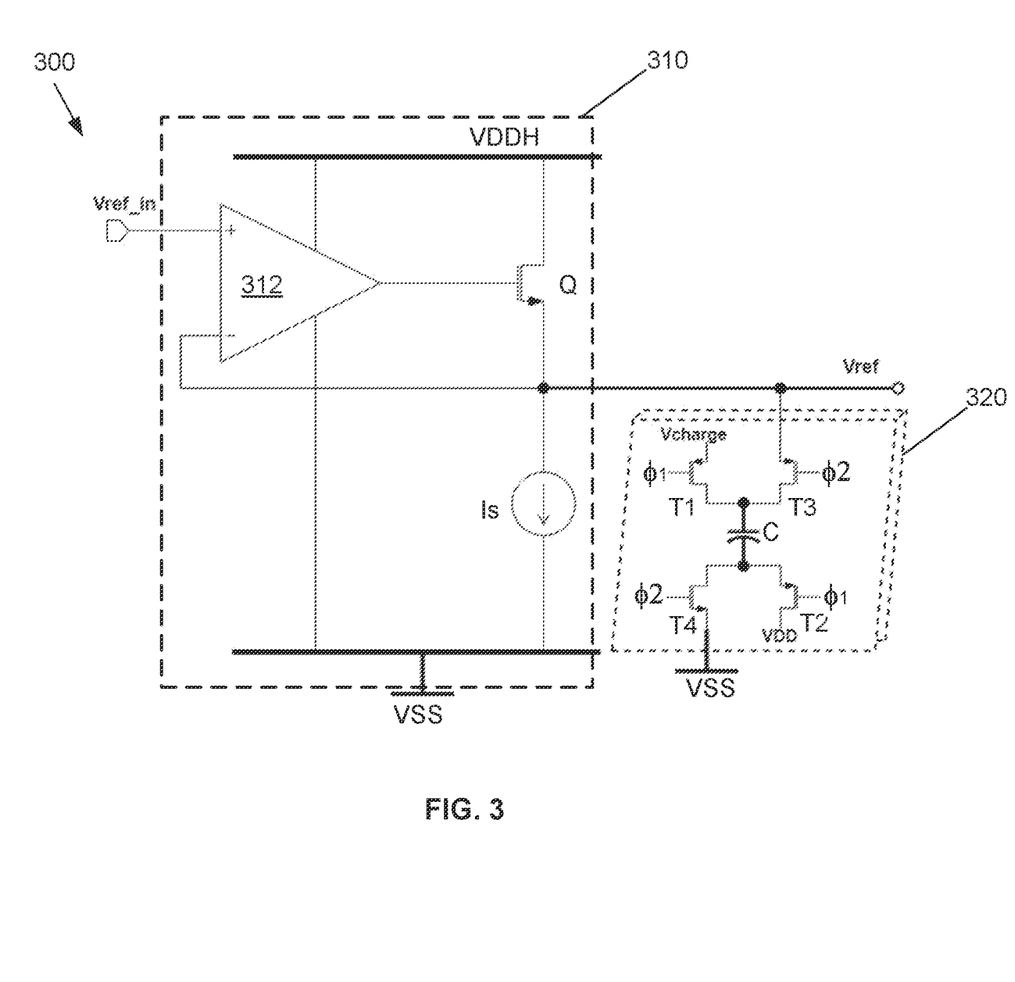
FIG. 3 is a schematic diagram illustrating an example implementation of a reference charge compensation (RCC) circuit, according to aspects of the subject technology.

FIG. 3 is a schematic diagram illustrating an example implementation 300 of an RCC circuit, according to aspects of the subject technology. The example implementation 300 of the RCC circuit includes, but is not limited to, a buffer circuit 310 and a charging circuit 320. The buffer circuit 310 provides the reference voltage Vref from an input reference voltage Vref_in. The buffer circuit 310 includes an operational amplifier (op-amp) 312, a transistor Q, and a current source Is, biased by supply voltages VDDH and VSS. The transistor Q and the current source Is are responsible for supplying current for the reference voltage Vref through the supply voltages VDDH and VSS.

In some embodiments, the charging circuit 320 is a clocked charging circuit controlled by two clock signals φ1 and φ2. The charging circuit 320 includes a capacitor C and transistors (switches) T1, T2, T3, and T4. In some embodiments, the charging circuit 320 provides charge pulses by injecting a charge into the reference-voltage port of the DAC circuit 110. The transistors T1, T2, T3, and T4 are controlled by the two clock signals φ1 and φ2, which are complementary clock signals. The clock signals φ1 and φ2 are referred to as complementary, as when one (e.g., φ1) is on the other one (e.g., φ2) is off and vice versa. For example, when clock signal φ1 has a positive value, the clock signal φ2 has a negative value. Transistors T1 and T2 are active (ON) when clock signal φ1 is at zero volts, which allows charging of the capacitor C by the Vcharge source and turn OFF when clock signal φ1 turns to a positive value. When clock signal φ2 is negative, transistor T3 turns ON to allow discharging of the capacitor C to the Vref, hence producing the compensation pulses 225 of FIG. 2.

Figure 4:
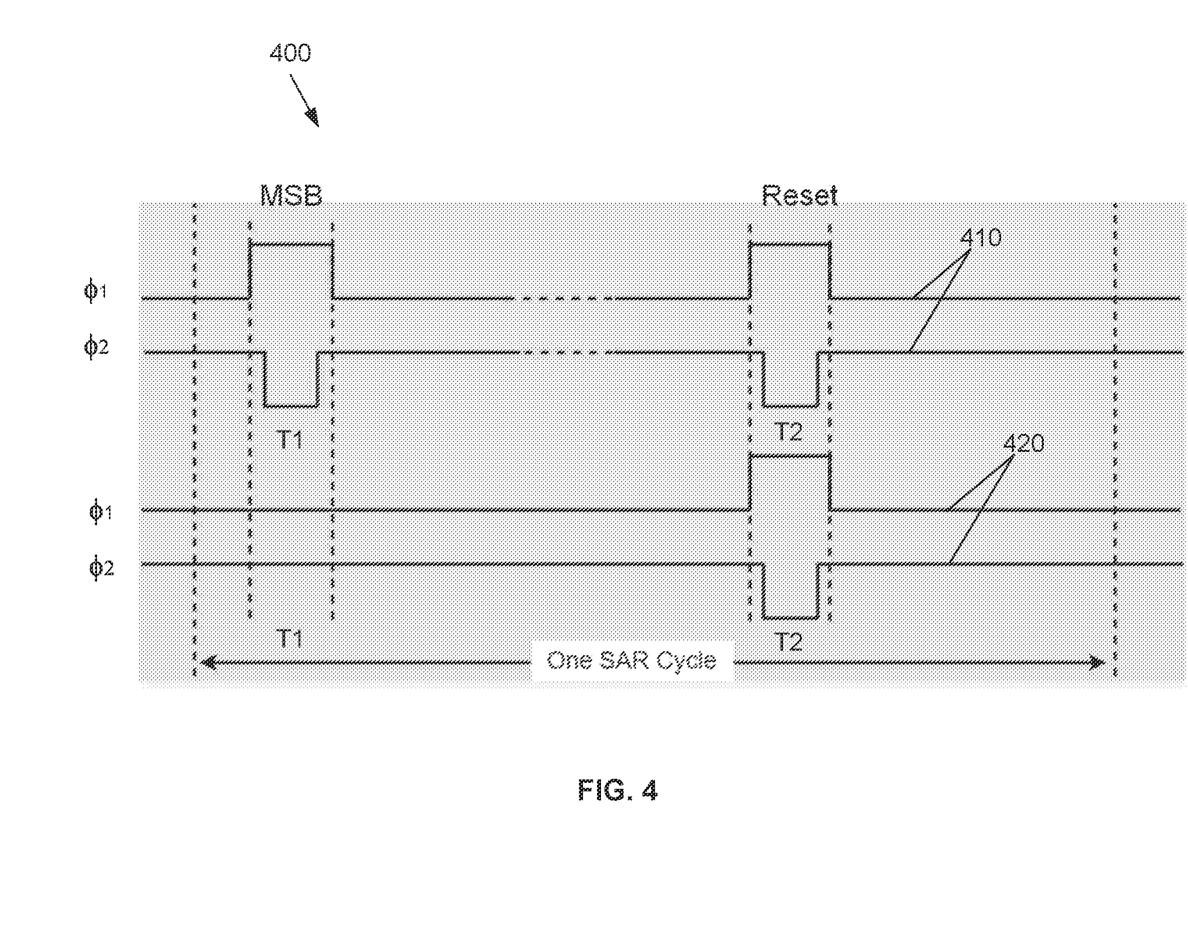
FIG. 4 is a chart illustrating examples of clock pulses used by the clocked charging circuit of FIG. 3, according to aspects of the subject technology.

FIG. 4 is a chart 400 illustrating examples of clock signals used by the clocked circuit 320 of FIG. 3, according to aspects of the subject technology. The chart 400 includes sets of clock signals 410 and 420 shown in a single SAR cycle. The set of clock signals 410 is used to offset (during T1) the MSB ripple and to offset (during T2) the second peak of the multiple pulses 222 of FIG. 2 (produced from the ripple 212). The set of clock signals 420 is used to offset (during T3) the first peak of the multiple pulses, which has a different timing from the second peak of the multiple pulses compensated by the set of clock signals 410.

Figure 5:
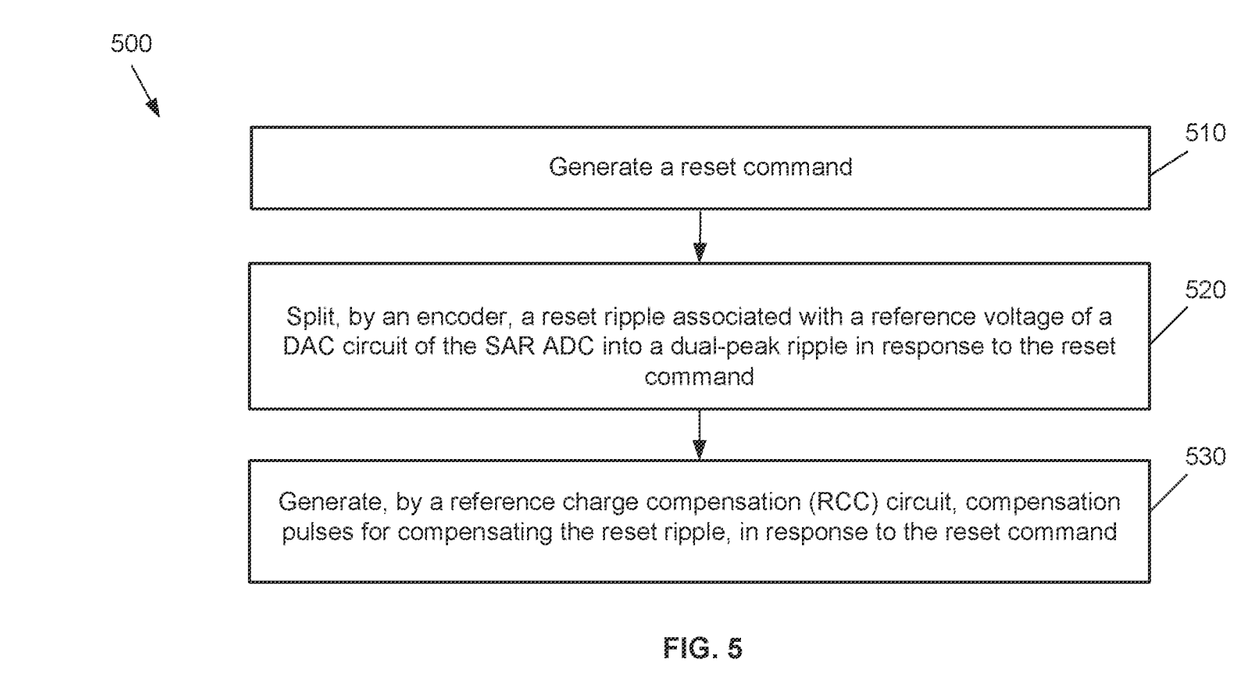
FIG. 5 is a flow diagram illustrating an example of a method for reference-ripple compensation for a SAR ADC, according to aspects of the subject technology.

FIG. 5 is a flow diagram illustrating an example of a method 500 for reference-ripple compensation for an ADC 100 of FIG. 1, according to aspects of the subject technology. The method 500 includes generating (e.g., by 130 of FIG. 1) a reset command (e.g., 134 of FIG. 1) (510) and splitting, by an encoder (e.g., 140 of FIG. 1), a ripple (e.g., 212 of FIG. 2) associated with a reference voltage (e.g., Vref of FIG. 1) of a DAC circuit (e.g., 110 of FIG. 1) of the SAR ADC into multiple pulses (e.g., 222 of FIG. 2) in response to the reset command (520). The method 500 further includes generating, by a compensation circuit (e.g., 150 of FIG. 1), compensation pulses (e.g., 225 of FIG. 2) for compensating the ripple, in response to the reset command (530). Generation of the reset command is based on a comparison of a DAC output signal (e.g., 112 of FIG. 1) with an analog input signal (e.g., Vin of FIG. 1) of the SAR ADC.

Figure 6:
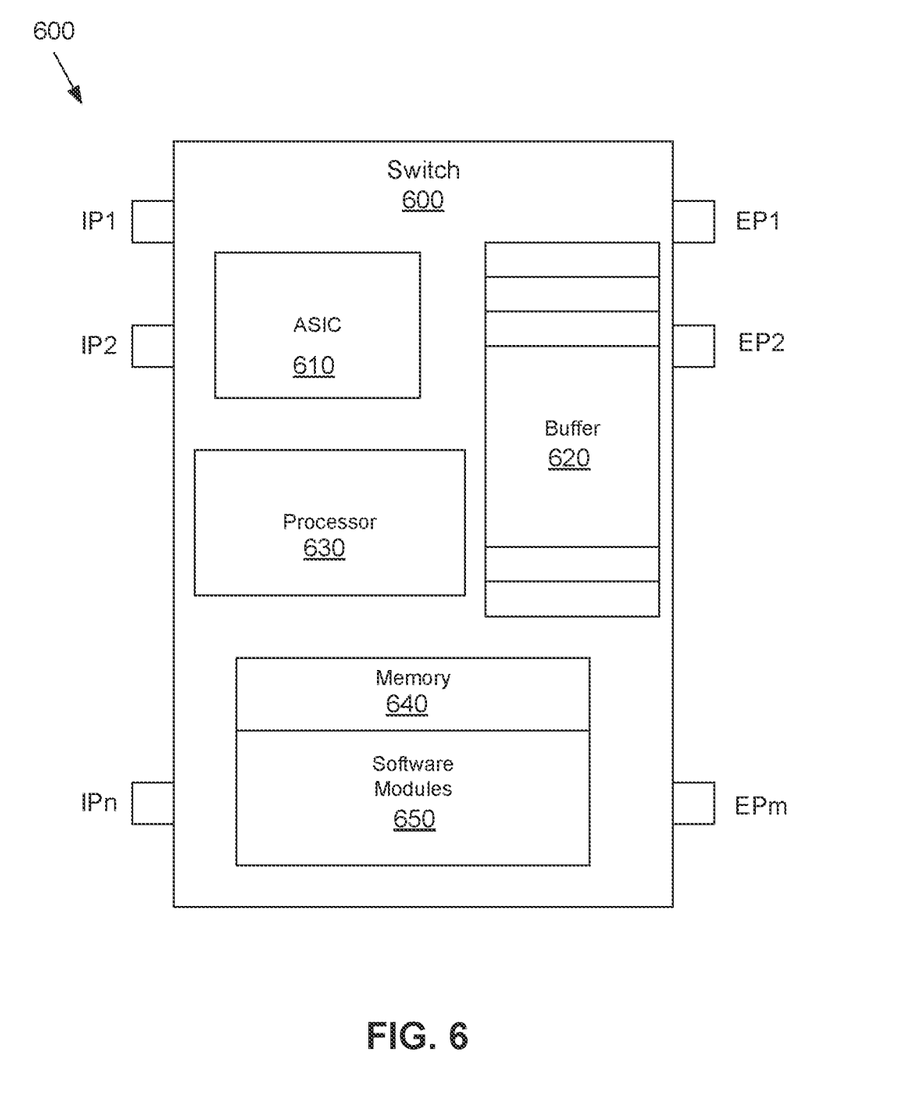
FIG. 6 is a block diagram illustrating an example electronic device within which aspects of the subject technology are implemented.

FIG. 6 is a block diagram illustrating an example electronic device 600 within which aspects of the subject technology are implemented. Examples of the electronic device 600 include a communication system, for instance, an Ethernet switch of an Ethernet network such as a private network including a data-center network, an enterprise network, or other private networks, which can benefit from the ripple compensation techniques of the subject technology. The electronic device 600 includes a number of ingress (input) ports IP1-IPn and multiple egress (output) ports EP1-EPm. In one or more implementations, one or more of the ingress ports IP1-IPn can receive a data packet from another switch or and endpoint device of the network. The electronic device 600 further includes a hardware component such as an application specific integrated circuit (ASIC) 610 (which in some embodiments can be implemented as a field-programmable logic array (FPGA)), a buffer 620, a processor 630, memory 640, and a software module 650.

In some implementations, the ASIC 610 can include suitable logic, circuitry, interfaces, and/or code that can be operable to perform functionalities of a PHY circuit. The buffer 620 includes suitable logic, circuitry, interfaces, and/ or code that are operable to receive and store and/or delay a block of data for communication through one or more of the egress ports EP1-EPm. The processor 630 includes suitable logic, circuitry, and/or code that can enable processing data and/or controlling operations of the electronic device 600. In this regard, the processor 630 can be enabled to provide control signals to various other portions of the electronic device 600. The processor 630 also controls transfers of data between various portions of the electronic device 600. Additionally, the processor 630 can enable implementation of an operating system or otherwise execute code to manage operations of the electronic device 600. In some implementations, the ASIC 610 may include a SAR ADC with reference ripple compensation such as the SAR ADC of FIG. 1.

The memory 640 includes suitable logic, circuitry, and/or code that can enable storage of various types of information, such as received data, generated data, code, and/or configuration information. The memory 640 includes, for example, RAM, ROM, flash, and/or magnetic storage. In various embodiment of the subject technology, the memory 640 may include RAM, DRAM, SRAM, T-RAM, Z-RAM, TTRAM, or any other storage media. The memory 640 can include software modules 650 that, when executed by a processor (e.g., processor 630), can perform some or all of the functionalities of the ASIC 610. In some implementations, the software modules 650 include codes that, when executed by a processor, can perform functionalities such as configuration of the electronic device 600.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but are to be accorded the full scope consistent with the language of the claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its), and vice versa. Headings and subheadings, if any, are used for convenience only, and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology, or that such aspect applies to all configurations of the subject technology. A disclosure relating to an aspect may apply to all configurations, or one or more configurations. A phrase such as an "aspect" may refer to one or more aspects, and vice versa. A phrase such as a "configuration" does not imply that such configuration is essential to the subject technology, or that such configuration applies to all configurations of the subject technology. A disclosure relating to a configuration may apply to all configurations, or one or more configurations. A phrase such as a "configuration" may refer to one or more configurations, and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise", as "comprise" is interpreted when employed as a transitional word in a claim.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. An analog-to-digital converter (ADC) circuit, comprising:
   a digital-to-analog converter (DAC) circuit configured to receive a reference voltage and provide an output signal based on the reference voltage;
   a comparator circuit configured to compare the output signal with an analog input signal and generate a comparison signal, wherein a reset command is generated based on the output signal being greater than the analog input signal;
   an encoder configured to compensate a ripple associated with the reference voltage by splitting the ripple into multiple pulses in response to the reset command; and
   a compensation circuit configured to generate, responsive to the reset command, compensation pulses to compensate the multiple pulses.

2. The ADC circuit of claim 1, further comprising a controller circuit configured to receive the comparison signal and generate the reset command.

3. The ADC circuit of claim 2, wherein the controller circuit comprises a finite state machine (FSM) circuit configured to provide the reset command to the encoder and the compensation circuit.

4. The ADC circuit of claim 1, wherein the compensation circuit comprises a reference charge compensation (RCC) circuit configured to generate two compensation pulses to compensate the multiple pulses.

5. The ADC circuit of claim 4, wherein the two compensation pulses to compensate the multiple pulses to reduce amplitudes of the multiple pulses to within a specified range.

6. The ADC circuit of claim 5, wherein widths and magnitudes of the two compensation pulses are adjustable to offset the multiple pulses.

7. The ADC circuit of claim 1, wherein the compensation circuit is further configured to generate a second set of compensation pulses to compensate an MSB ripple generated based on the reference voltage.

8. The ADC circuit of claim 1, wherein the compensation circuit is further configured to generate the compensation pulses prior to receiving, by the DAC circuit, a subsequent reference voltage.

9. The ADC circuit of claim 1, wherein the compensation circuit is further configured to generate the compensation pulses by providing a charge into a reference-voltage port of the DAC circuit.

10. The ADC circuit of claim 9, wherein the compensation circuit comprises a charging circuit configured to provide charge pulses for providing the reference-voltage port.

11. An integrated circuit comprising:
a controller configured to generate a reset command;
an encoder configured to split a ripple associated with a reference voltage of a digital-to-analog converter (DAC) circuit into multiple pulses in response to the reset command; and
a compensation circuit configured to generate compensation pulses in response to the reset command,
wherein:
the reset command is generated based on an output signal of the DAC circuit being greater than an analog input signal, and
the compensation pulses are configured to compensate the multiple pulses associated with the ripple.

12. The integrated circuit of claim 11, wherein the controller comprises a finite state machine (FSM) circuit configured to generate the reset command and provide the reset command to the encoder and the compensation circuit.

13. The integrated circuit of claim 11, wherein the encoder is further configured to double a size of a reset window by splitting MSB ripples and least significant bit (LSB) ripples in time domain.

14. The integrated circuit of claim 11, wherein the compensation circuit comprises a reference charge compensation (RCC) circuit, wherein the RCC circuit is configured to generate two compensation pulses to compensate the multiple pulses, wherein widths and magnitudes of the two compensation pulses are adjusted to offset the multiple pulses to reduce amplitudes of the multiple pulses to a level within a specified range, and wherein the multiple pulses comprise a dual-peak ripple.

15. The integrated circuit of claim 11, wherein the compensation circuit is configured to generate the compensation pulses by injecting a charge into a reference-voltage port of the DAC circuit.

16. The integrated circuit of claim 15, further comprising a charging circuit, wherein the charging circuit is controlled by two clock signals and is configured to provide charge pulses for injection into the reference-voltage port.

17. An apparatus, comprising:
an encoder configured to receive a reset command from a controller circuit and, in response to the reset command, split a ripple associated with a reference voltage of a digital-to-analog converter (DAC) circuit of an analog-to-digital converter (ADC) circuit into multiple pulses; and
a compensation circuit configured to receive the reset command from the controller circuit and, in response to the reset command, generate compensation pulses for compensating the multiple pulses,
wherein generation of the reset command is based on an output signal of the DAC circuit being greater than an analog input signal of the ADC circuit.

18. The apparatus of claim 17, wherein the encoder is configured split a most significant bit (MSB) ripples and a least significant bit (LSB) ripples in time domain.

19. The apparatus of claim 17, wherein;
the compensation circuit comprises a reference charge compensation (RCC) circuit, and
the RCC circuit is configured to generate two compensation pulses by injecting a charge into a reference-voltage port of the DAC circuit.

20. The apparatus of claim 19, wherein:
widths and magnitudes of the two compensation pulses are adjusted for compensating the multiple pulses to reduce amplitudes of the multiple pulses to a level within a specified range, and
the multiple pulses comprise a dual-peak ripple.

* * * * *